United States Patent [19]

Gillery

[11] Patent Number: 4,861,669
[45] Date of Patent: Aug. 29, 1989

[54] SPUTTERED TITANIUM OXYNITRIDE FILMS

[75] Inventor: Frank H. Gillery, Allison Park, Pa.

[73] Assignee: PPG Industries, Inc., Pittsburgh, Pa.

[21] Appl. No.: 31,319

[22] Filed: Mar. 26, 1987

[51] Int. Cl.[4] .............................................. B32B 15/04
[52] U.S. Cl. .................................... 428/434; 428/630; 428/432; 428/672
[58] Field of Search ............... 428/432, 621, 627, 632, 428/672, 651, 433, 434

[56] References Cited

U.S. PATENT DOCUMENTS

| 3,990,784 | 11/1976 | Gelber | 350/166 |
| 4,022,947 | 5/1977 | Grubb et al. | 428/432 |
| 4,450,201 | 5/1984 | Brill et al. | 428/432 X |
| 4,534,841 | 8/1985 | Hartig et al. | 204/192 |
| 4,535,000 | 8/1985 | Gordon | 427/160 |
| 4,546,050 | 10/1985 | Amberger | 428/630 |

Primary Examiner—Nancy A. B. Swisher
Attorney, Agent, or Firm—Donna L. Seidel

[57] ABSTRACT

A sputtered titanium oxynitride film is disclosed, as well as a low emissivity coated article comprising a titanium oxynitride film in combination with a highly infrared reflective metal film, such as silver.

6 Claims, 2 Drawing Sheets

SPUTTERED TITANIUM OXYNITRIDE FILMS

BACKGROUND OF THE INVENTION

The present invention relates generally to the art of sputtering metal-containing films on nonmetallic substrates, and more particularly to the art of magnetic sputtering of multiple-layer metal-dielectric transparent films on glass.

U.S. Pat. No. 3,990,784 to Gelber discloses a coated architectural glass system comprising a transparent substrate and a multi-layer coating comprising first and second metal layers with a dielectric layer between them, wherein the first and second metal layers have a thickness ratio so that the transmission of the coating can be changed independent of its reflection properties by varying the thickness of the metal layers while maintaining the ratio constant. The dielectric has a thickness such that the reflection from the coating is not strongly colored.

U.S. Pat. No. 4,022,947 to Grubb et al discloses a transparent panel capable of transmitting a desired portion of visible radiation while reflecting a large portion of incident solar radiation and a method of preparing same, by sputtering an iron, nickel and chromium alloy to obtain a transparent metal film, and reactively sputtering the same or a similar alloy in the presence of oxygen to form an oxide film. In one preferred embodiment, the metal film lies between the substrate and the metal oxide film. In another preferred embodiment, the metal oxide film lies between the substrate and the metal film.

U.S. Pat. No. 4,534,841 to Hartig et al. discloses solar-control glazing produced by applying first an oxide layer having an optical thickness of 20 to 280 nanometers to a transparent substrate by cathodic evaporation and second a chromium nitride layer having a geometric thickness of 10 to 40 nanometers. An optical third dielectric layer may be applied to the second layer. The oxide layer is selected from oxides of tin, titanium and aluminum.

U.S. Pat. No. 4,535,000 to Gordon discloses placing a thin film of metal nitride, e.g. titanium nitride, on a glass substrate by mixing a metal halide with a reducing gas like ammonia at 250° to 320° C. and reacting the gases at the glass surface heated to 400° to 700° C. to form the film on the glass.

U.S. Pat. No. 4,546,050 to Amberger et al discloses a glass sheet with a multilayer coating selected from the group consisting of copper, stainless steel, titanium dioxide; copper, titanium, titanium dioxide; and copper, titanium, titanium nitride.

Architectural glass products with metallic and/or metal oxide films are growing in importance as energy demands for heating and cooling become increasingly expensive. Coated glass architectural products generally fall into two categories, solar energy control and high transmittance, low emissivity coated products.

Solar energy control glass products are generally glass substrates, often tinted, coated with a low visible transmittance colored film which reduces solar energy transmittance through the windows into the building interior, thereby reducing air conditioning costs. These products are most effective in warm climates and are most often seen in commercial construction. In areas where heating costs are of greater concern, and particularly in residential construction, high transmittance, low emissivity coatings are desirable in order to allow high transmittance of visible light into the interior while reflecting infrared radiation to retain heat inside the building. High transmittance, low emissivity coatings are typically multiple layer films wherein an infrared reflecting metal such as silver, gold or copper is sandwiched between anti-reflective metal oxide layers such as bismuth, indium and/or tin oxides. Solar energy control films, on the other hand, are typically single layer films of one or more metals or oxides of metals such as cobalt, iron, chromium, nickel, copper, etc.

Wet chemical methods for producing metallic films for solar energy control are well known from U.S. Pat. Nos. 3,846,152; 4,091,172; 3,723,158 and 3,457,138. Pyrolytic methods for producing metal oxide films for solar energy control are well known from U.S. Pat. Nos. 3,660,061; 3,658,568; 3,978,272 and 4,100,330. Sputtering technologies for producing high transmittance, low emissivity multiple layer coatings are disclosed in U.S. Pat. No. 4,462,884 and No. 4,508,789. Sputtering techniques for producing solar control films are disclosed in U.S. Pat. No. 4,512,863 and No. 4,594,137.

SUMMARY OF THE INVENTION

The present invention provides a novel and superior dielectric film for use in a wide variety of architectural coatings on glass. The present invention involves sputtering a titanium cathode in an atmosphere comprising oxygen and nitrogen in order to deposit a film comprising titanium oxynitride. The titanium oxynitride film of the present invention may be deposited in combination with an infrared reflective film such as silver to form a low emissivity coating.

DESCRIPTION OF THE PREFERRED EMBODIMENTS

A transparent, nonmetallic substrate, preferably glass, is coated by cathode sputtering, preferably magnetron sputtering, to provide a solar energy control product with desirable durability and aesthetic properties comprising titanium oxynitride.

In a conventional magnetron sputtering process, a substrate is placed within a coating chamber in facing relation with a cathode having a target surface of the material to be sputtered. Preferred substrates in accordance with the present invention include glass, ceramics and plastics which are not detrimentally affected by the operating conditions of the coating process.

The cathode may be of any conventional design, preferably an elongated rectangular design, connected with a source of electrical potential, and preferably employed in combination with a magnetic field to enhance the sputtering process. At least one cathode target surface comprises titanium which is sputtered in a reactive atmosphere to form a film. The anode is preferably a symmetrically designed and positioned assembly as taught in U.S. Pat. No. 4,478,702 by Gillery et al, the disclosure of which is incorporated herein by reference.

For deposition of a titanium oxynitride film in accordance with the present invention, a target of titanium is sputtered in a vacuum. The cathode may be stationery while the substrate passes, or a scanning cathode may be used with a stationary substrate. The gas composition of the atmosphere in the coating chamber may be varied from about 10 to 50 percent oxygen and 90 to 50 percent nitrogen. Preferably, the gas composition ranges from 10 to 25 percent oxygen and 75 to 90 percent nitrogen.

Figure 1:
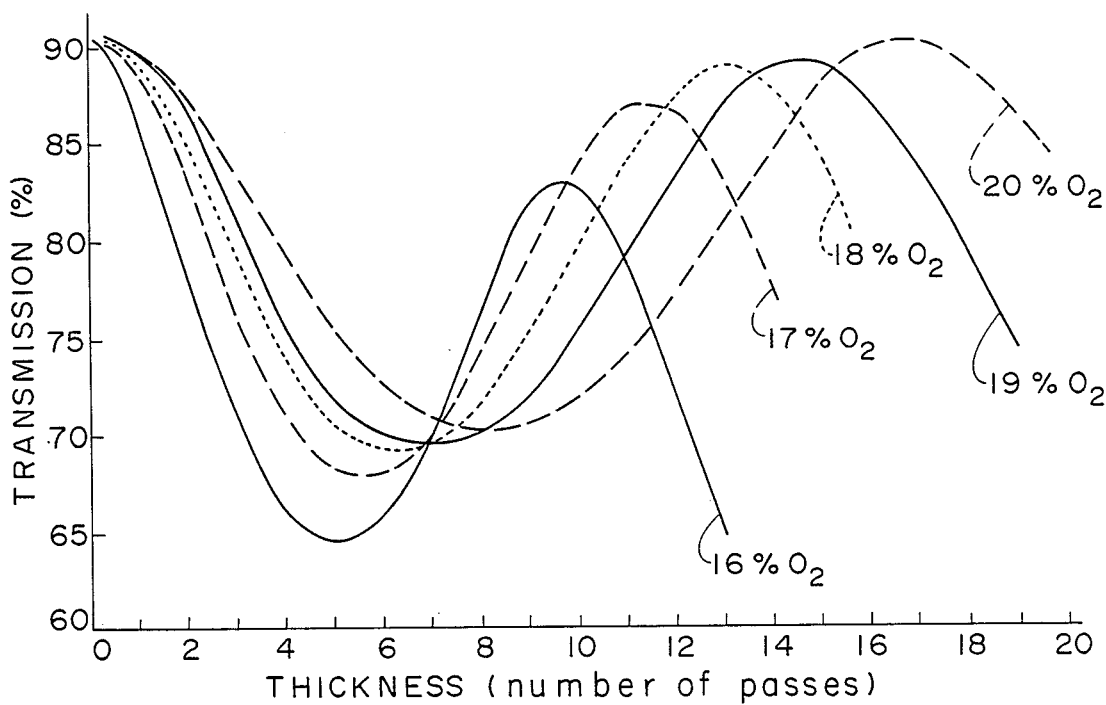
FIG. 1 illustrates the percent transmittance at 550 nanometers (nm) of a titanium oxynitride film on glass as a function of film thickness, measured in number of cathode passes, at various percentages of oxygen in nitrogen.
Figure 2:
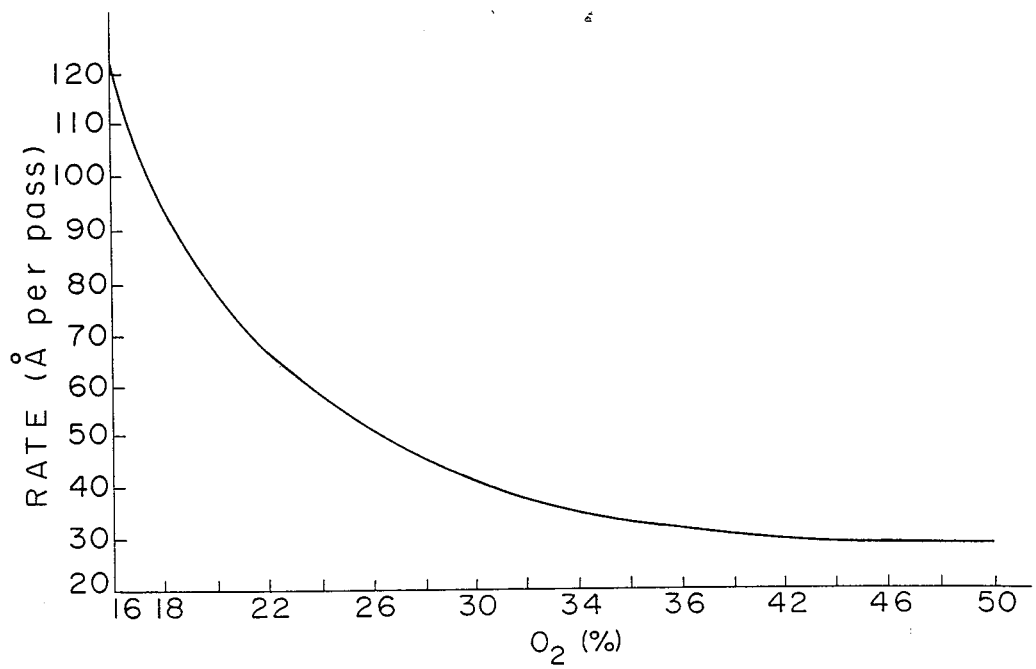
FIG. 2 illustrates the deposition rate, in Angstroms per cathode pass, of a titanium oxynitride film as a function of oxygen concentration in the atmosphere of the coating chamber.
Figure 3:
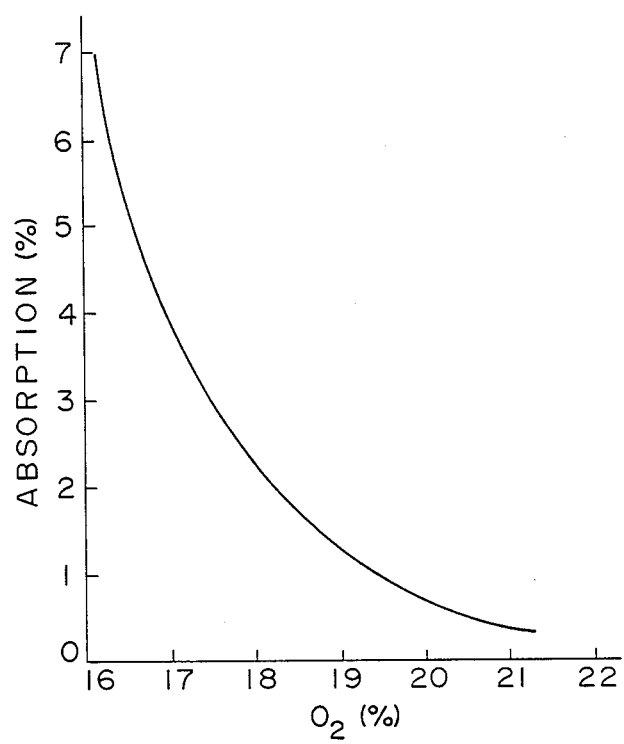
FIG. 3 illustrates the absorption of a quarter-wavelength (about 600 Angstroms thick) titanium oxynitride film as a function of the oxygen concentration in the atmosphere of the coating chamber.

FIG. 1 illustrates the percent transmittance at 550 nm of a titanium oxynitride film on glass as a function of film thickness, measured in number of cathode passes, at various percentages of oxygen in nitrogen. FIG. 2 illustrates the deposition rate, in Angstroms per cathode pass, of a titanium oxynitride film as a function of oxygen concentration in the atmosphere of the coating chamber. FIG. 3 illustrates the absorption of a titanium oxynitride film as a function of oxygen concentration in the atmosphere of the coating chamber.

These figures show that the properties of a titanium oxynitride film change gradually and continuously as the oxygen/nitrogen gas composition is changed. In contrast, titanium sputtered in an oxygen/argon mixture exhibits a sudden change from titanium metal to titanium oxide. These figures also show that sputtering cinditions can be chosen such that a titanium oxynitride film with desired absorbance and transmittance can be deposited by sputtering at a preferred deposition rate.

In a preferred embodiment of the present invention, a multiple layer film is deposited by cathode sputtering to form a high transmittance, low emissivity coating. In addition to the titanium target, at least one other cathode target surface comprises a metal to be sputteredto form a reflective metallic layer. A multiple layer coating having a reflective metallic layer in combination with an anti-reflective titanium oxynitride layer is produced as follows.

A clean glass substrate is placed in a coating chamber which is evacuated, preferably to less than $10^{-4}$ torr, more preferably less than $2 \times 10^{-5}$ torr. A selected atmosphere of reactive gases, preferably nitrogen and oxygen, is established in the chamber to a pressure between about $5 \times 10^{-4}$ and $10^{-5}$ torr. A cathode having a target surface of titanium is operated, preferably at a power level of 5 to 10 kilowatts, over the surface of the substrate to be coated. The target metal is sputtered, reacting with the atmosphere in the chamber to deposit a titanium oxynitride coating layer on the glass surface.

After the initial layer of titanium oxynitride is deposited, the coating chamber is evacuated, and an inert atmosphere such as pure argon is established at a pressure between about $5 \times 10^{-4}$ and $10^{-2}$ torr. A cathode having a target surface of silver metal is operated over the titanium oxynitride coated surface. The target metal is sputtered and deposits a uniform, highly infrared reflective, conductive metallic layer on the titanium oxynitride coated glass surface. A second layer of titanium oxynitride is deposited on the silver layer under essentially the same conditions used to deposit the first titanium oxynitride layer.

The present invention will be further understood from the descriptions of specific examples which follow.

EXAMPLE I

A titanium cathode target measuring 5 b8y 17 inches (about 12.7 by 43.2 centimeters) is powered at 10 kilowatts in a vacuum chamber containing an atmosphere of 23 percent oxygen and 77 percent nitrogen at a pressure of 4 millitorr. The cathode is stationary while a glass substrate passes under the sputtering target surface at a rate of 120 inches (about 3 meters) per minute. Four passes deposit a film comprising titanium oxynitride on the glass surface to a luminous transmittance of 75.7 percent.

EXAMPLE II

A glass substrate is coated with a first layer comprising titanium oxynitride as in Example I. The titanium oxynitride coated surface is then coated with a uniform layer of silver by sputtering a silver cathode target powered at 0.27 kilowatts in an argon atmosphere at a pressure of 4 millitorr to a final luminous transmittance of 68 percent. To protect the silver from oxidation, a very thin protective coating of titanium is deposited in one pass of the titanium cathode powered at 0.03 kilowatts in argon at 4 millitorr to a final luminous transmittance of 67.5 percent.

EXAMPLE III

A glass substrate is coated with titanium oxynitride and silver as in the previous examples. After depositing the thin, protective layer of titanium, a second layer of titanium oxynitride is deposited to a final luminous transmittance of 82.1 percent, thereby producing a high transmittance, low emissivity coated article.

The above examples are offered to illustrate the present invention. The titanium oxynitride film of the present invention may be deposited under a variety of sputtering conditions, and may be used in combination with metals other than silver, such as gold or copper. The titanium oxynitride may be deposited under, over, or on both sides of a metallic layer, and in combination with various primer and/or protective layers. The scope of the invention is defined by the following claims.

I claim:
1. An article of manufacture comprising:
    a. a transparent, nonmetallic substrate;
    b. a first transparent metal film of highly infrared reflective metal;
    c. a second transparent metal film of a protective metal over the infrared reflective metal film; and
    d. a sputtered titanium oxynitride film.
2. An article according to claim 1, wherein said substrate is glass.
3. An article according to claim 2, further comprising a second titanium oxynitride film deposited between said substrate and said film of highly infrared reflective metal.
4. An article according to claim 3, wherein said highly infrared reflective metal is selected from the group consisting of gold, silver and copper.
5. An article according to claim 4, wherein said metal is silver.
6. An article of manufacture comprising:
    a. a glass substrate;
    b. a first layer of titanium oxynitride on the glass surface;
    c. a silver film deposited over said first titanium oxynitride layer;
    d. a film comprising titanium over the silver film; and
    a second layer of titanium oxynitride deposited over said film comprising titanium.

* * * * *